(12) United States Patent
Arayashiki et al.

(10) Patent No.: US 10,985,712 B2
(45) Date of Patent: Apr. 20, 2021

(54) POWER AMPLIFICATION MODULE

(71) Applicant: Murata Manufacturing Co., Ltd., Kyoto (JP)

(72) Inventors: Satoshi Arayashiki, Kyoto (JP); Satoshi Goto, Kyoto (JP); Satoshi Tanaka, Kyoto (JP); Yasuhisa Yamamoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 30 days.

(21) Appl. No.: 16/351,916

(22) Filed: Mar. 13, 2019

(65) Prior Publication Data

US 2020/0295717 A1 Sep. 17, 2020

(51) Int. Cl.
| | | |
|---|---|---|
| *H03F 3/04* | (2006.01) | |
| *H03F 3/68* | (2006.01) | |
| *H03F 3/21* | (2006.01) | |
| *H03F 1/02* | (2006.01) | |
| *H03F 3/193* | (2006.01) | |
| *H03F 1/30* | (2006.01) | |

(52) U.S. Cl.
CPC ............ *H03F 3/21* (2013.01); *H03F 1/0261* (2013.01); *H03F 3/193* (2013.01); *H03F 1/302* (2013.01); *H03F 3/211* (2013.01)

(58) Field of Classification Search
CPC ........... H03F 3/21; H03F 1/0261; H03F 3/193
USPC ..................................... 330/124 R, 295, 277
See application file for complete search history.

(56) References Cited

U.S. PATENT DOCUMENTS

| | | | |
|---|---|---|---|
| 6,605,999 | B2 | 8/2003 | Matsushita et al. |
| 6,970,040 | B1 * | 11/2005 | Dening ................. H03F 1/0277 330/124 R |
| 7,193,476 | B2 | 3/2007 | Honda |
| 9,654,075 | B2 | 5/2017 | Arayashiki et al. |
| 2006/0103466 | A1 | 5/2006 | Shah et al. |
| 2007/0096810 | A1 | 5/2007 | Hageman et al. |
| 2014/0049322 | A1 | 2/2014 | Jeon et al. |
| 2016/0315594 | A1 | 10/2016 | Arayashiki et al. |
| 2017/0214375 | A1 | 7/2017 | Arayashiki et al. |

FOREIGN PATENT DOCUMENTS

| | | |
|---|---|---|
| JP | 2004-128704 A | 4/2004 |
| JP | 2004-201027 A | 7/2004 |
| JP | 2013-131802 A | 7/2013 |

* cited by examiner

*Primary Examiner* — Khanh V Nguyen
*Assistant Examiner* — Khiem D Nguyen
(74) *Attorney, Agent, or Firm* — Pearne & Gordon LLP

(57) ABSTRACT

Provided is a power amplification module that includes: a first transistor, a first signal being inputted to a base thereof; a second transistor, the first signal being inputted to a base thereof and a collector thereof being connected to a collector of the first transistor; a first resistor, a first bias current being supplied to one end thereof and another end thereof being connected to the base of the first transistor; a second resistor, one end thereof being connected to the one end of the first resistor and another end thereof being connected to the base of the second transistor; and a third resistor, a second bias current being supplied to one end thereof and another end thereof being connected to the base of the second transistor.

8 Claims, 10 Drawing Sheets

POWER AMPLIFICATION MODULE

BACKGROUND OF THE DISCLOSURE

1. Field of the Disclosure

The present disclosure relates to a power amplification module.

2. Description of the Related Art

A power amplification module is used in a mobile communication device such as a cellular phone in order to amplify the power of a signal to be transmitted to a base station. In such a power amplification module, the gain may be switched in accordance with the output level in order to improve the power addition efficiency. For example, in Japanese Unexamined Patent Application Publication No. 2004-128704, a configuration is disclosed in which the gain is adjusted by changing the current that flows to an amplifier of a power amplification module in a power amplification circuit formed of transistors that are connected in parallel with each other. In this configuration, variations in the input impedance that occur with a change in current are suppressed by a complicated large-scale control circuit mounted on the bias circuit side of the power amplification module.

However, there is a demerit in mounting a complicated large-scale control circuit in a power amplification module in order to suppress the variations in input impedance in that the chip area becomes larger. On the other hand, when the number of operating transistors is changed in order to adjust the gain, the input impedance of the power amplification circuit changes. Consequently, the voltage standing wave ratio (VSWR) at the input of the power amplification circuit may be degraded.

BRIEF SUMMARY OF THE DISCLOSURE

The present disclosure was made in light of such circumstances and it is an object thereof to suppress a change in input impedance that occurs with a change in gain in a power amplification module that is capable of changing the gain thereof.

A power amplification module according to a preferred embodiment of the present disclosure includes: first transistor, a first signal being inputted to a base thereof; a second transistor, the first signal being inputted to a base thereof and a collector thereof being connected to a collector of the first transistor; a first resistor, a first bias current being supplied to one end thereof and another end thereof being connected to the base of the first transistor; a second resistor, one end thereof being connected to the one end of the first resistor and another end thereof being connected to the base of the second transistor; and a third resistor, a second bias current being supplied to one end thereof and another end thereof being connected to the base of the second transistor. At the time of a high gain mode, the first bias current is supplied to the bases of the first and second transistors via the first and second resistors, respectively. At the time of a low gain mode, the second bias current is supplied to the base of the second transistor via the third resistor and is supplied to the base of the first transistor via the third, second and first resistors, and a second signal, which is obtained by amplifying the first signal, is outputted from the collectors of the first and second transistors.

According to the preferred embodiment of the present disclosure, a change in input impedance that occurs with a change in gain can be suppressed in a power amplification module that is capable of changing the gain thereof.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Figure 1:
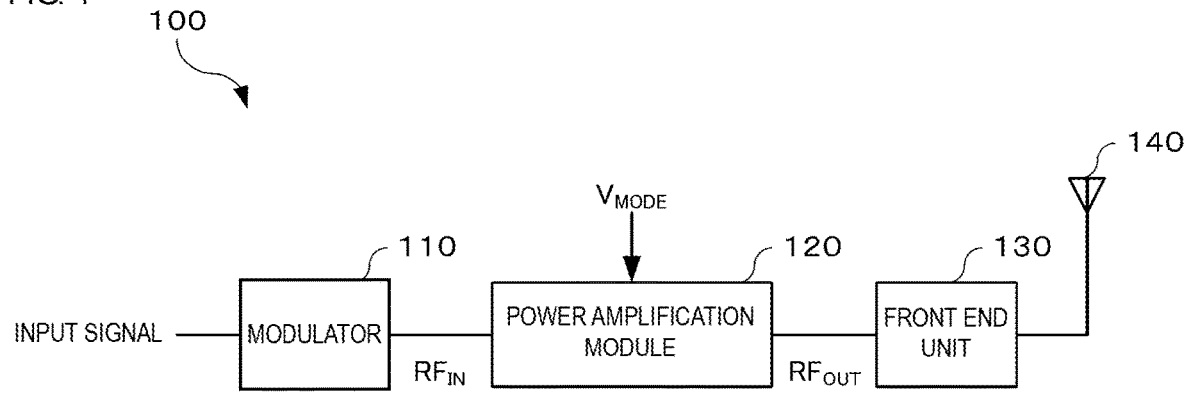
FIG. 1 illustrates an example configuration of a transmission unit that includes a power amplification module according to an embodiment of the present disclosure.

Hereafter, an embodiment of the present disclosure will be described while referring to the drawings. FIG. 1 illustrates an example configuration of a transmission unit that includes a power amplification module according to an embodiment of the present disclosure. A transmission unit 100 is for example used in a mobile communication device such as a cellular phone in order to transmit various signals such as speech and data to a base station. Although such a mobile communication device would also be equipped with a reception unit for receiving signals from the base station, the description of such a reception unit is omitted here.

As illustrated in FIG. 1, the transmission unit 100 includes a modulator 110, a power amplification module 120, a front end unit 130 and an antenna 140.

The modulator 110 modulates an input signal on the basis of a modulation scheme such as high speed uplink packet access (HSUPA) or long term evolution (LTE) and generates a radio frequency (RF) signal for performing wireless transmission. The RF signal has a frequency of around several hundred MHz to several GHz, for example.

The power amplification module 120 amplifies the power of the RF signal ($RF_{IN}$) outputted from the modulator 110 up to the level that is required to transmit the RF signal to the base station, and outputs an amplified signal ($RF_{OUT}$). The power amplification module 120 operates in a gain mode that corresponds to a gain mode control voltage $V_{MODE}$. The gain mode may be a high gain mode or a low gain mode, for example.

The front end unit 130 filters the amplified signal and switches a reception signal received from the base station. The amplified signal outputted from the front end unit 130 is transmitted to the base station via the antenna 140.

Figure 2:
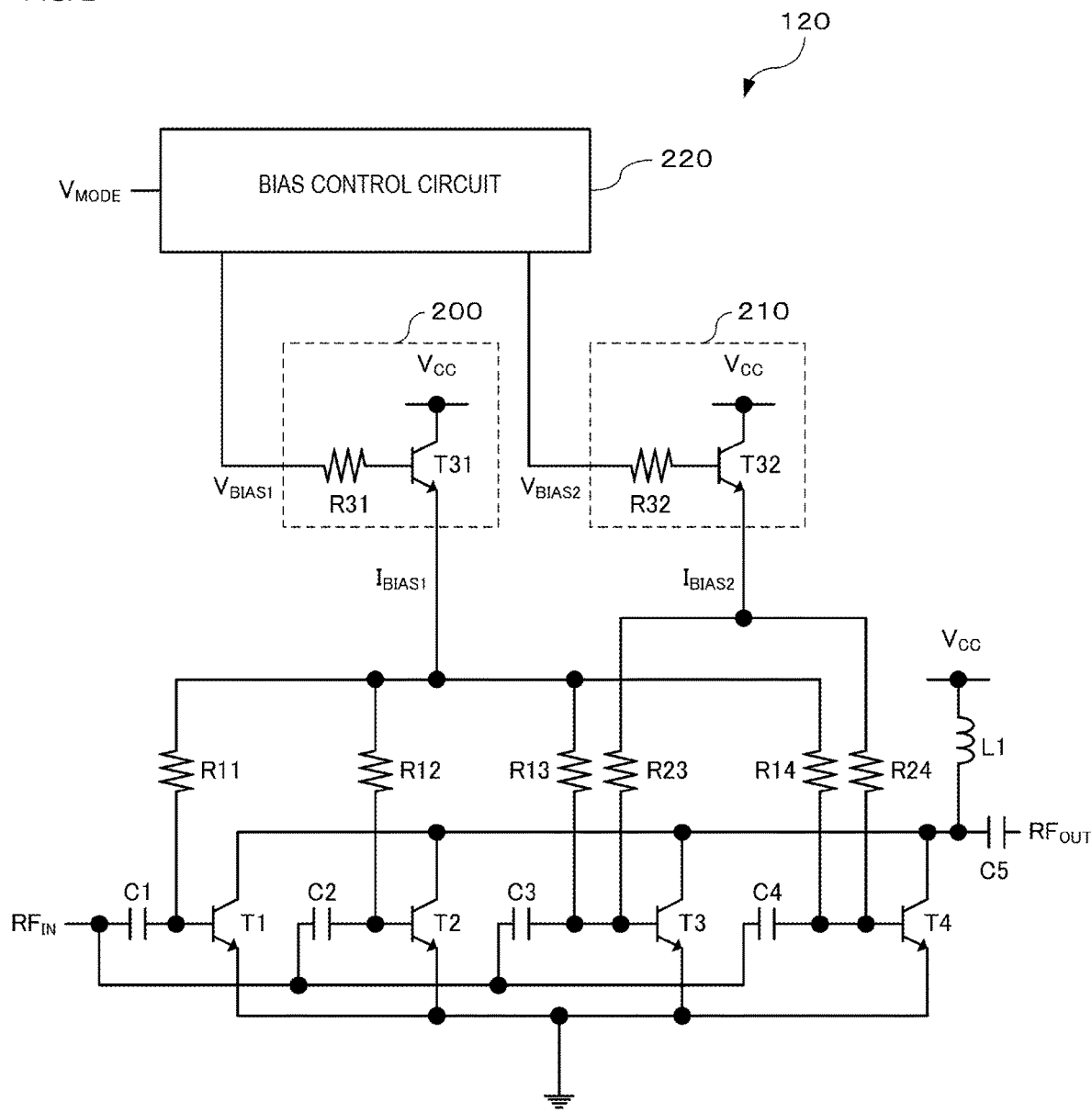
FIG. 2 illustrates an example of the configuration of a power amplification module.

FIG. 2 illustrates an example of the configuration of the power amplification module 120. The power amplification module 120 includes transistors T1, T2, T3 and T4, capacitors C1, C2, C3, C4 and C5, resistors R11, R12, R13, R14, R23 and R24, an inductor L1, bias circuits 200 and 210 and a bias control circuit 220.

The transistors T1 to T4 are amplification transistors and are heterojunction bipolar transistors (HBTs), for example. The transistors T1 to T4 are connected in parallel with one another and form a single amplification circuit. Each of the transistors T1 to T4 can serve as one finger of a multi-finger transistor. The RF signal ($RF_{IN}$) is inputted to the bases of the transistors T1 to T4 via the capacitors C1 to C4, respectively. In addition, a power supply voltage $V_{CC}$ is supplied to the collectors of the transistors T1 to T4 via the inductor L1. The transistors T1 to T4 output the amplified signal ($RF_{OUT}$) of the RF signal ($RF_{IN}$) from their collectors via the capacitor C5.

A bias current $I_{BIAS1}$ is supplied to one end of the resistor R11 and the other end of the resistor R11 is connected to the base of the transistor T1. The bias current $I_{BIAS1}$ is supplied to one end of the resistor R12 and the other end of the resistor R12 is connected to the base of the transistor T2. The bias current $I_{BIAS1}$ is supplied to one end of the resistor R13 and the other end of the resistor R13 is connected to the base of the transistor T3. The bias current $I_{BIAS1}$ is supplied to one end of the resistor R14 and the other end of the resistor R14 is connected to the base of the transistor T4. A bias current $I_{BIAS2}$ is supplied to one end of the resistor R23 and the other end of the resistor R23 is connected to the base of the transistor T3. The bias current $I_{BIAS2}$ is supplied to one end of the resistor R24 and the other end of the resistor R24 is connected to the base of the transistor T4.

The bias circuit 200 generates the bias current $I_{BIAS1}$ on the basis of a bias control voltage $V_{BIAS1}$. The bias circuit 200 includes a transistor T31, for example. The transistor T31 is an HBT, for example. The bias control voltage $V_{BIAS1}$ is supplied to the base of the transistor T31, the power supply voltage $V_{CC}$ is supplied to the collector of the transistor T31 and the emitter of the transistor T31 is connected to one end of each of the resistors R11 to R14.

The bias circuit 210 generates the bias current $I_{BIAS2}$ on the basis of a bias control voltage $V_{BIAS2}$. The bias circuit 210 includes a transistor T32, for example. The transistor T32 is an HBT, for example. The bias control voltage $V_{BIAS2}$ is supplied to the base of the transistor T32, the power supply voltage $V_{CC}$ is supplied to the collector of the transistor T32 and the emitter of the transistor T32 is connected to one end of each of the resistors R23 and R24.

The bias control circuit 220 controls the bias control voltages $V_{BIAS1}$ and $V_{BIAS2}$ on the basis of the gain mode control voltage $V_{MODE}$. Specifically, at the time of the high gain mode, the bias control circuit 220 makes the bias control voltage $V_{BIAS1}$ be at a high level and the bias control voltage $V_{BIAS2}$ be at a low level. In addition, at the time of the low gain mode, the bias control circuit 220 makes the bias control voltage $V_{BIAS2}$ be at the high level and the bias control voltage $V_{BIAS1}$ be at the low level. The high level is a voltage that is higher than a threshold voltage at which the transistors T31 and T32 that form the bias circuits 200 and 210 switch on and the low level is a voltage that is lower than this threshold voltage.

Figure 3:
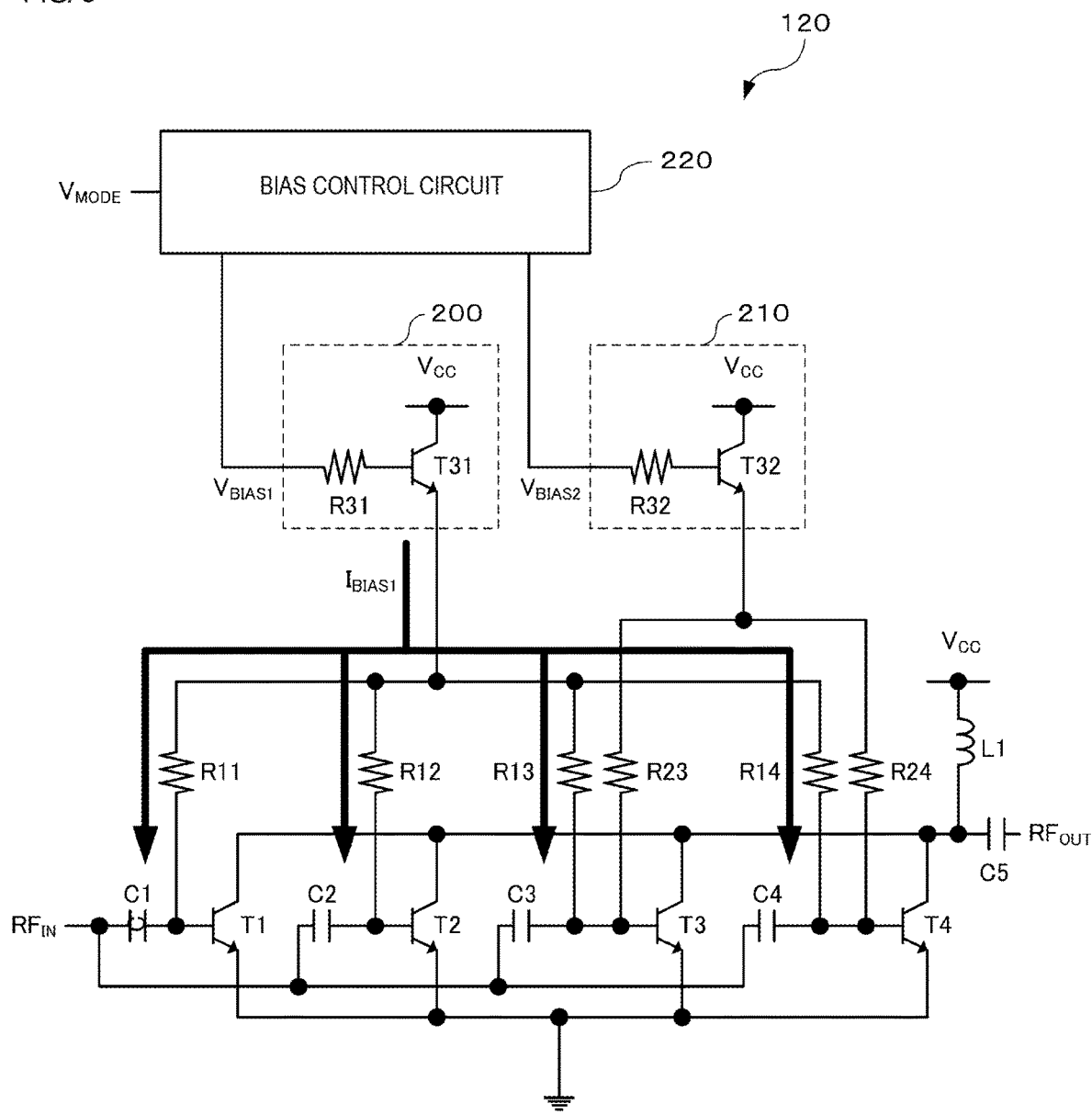
FIG. 3 is a diagram for explaining the operation of the power amplification module in the case of a high gain mode.
Figure 4:
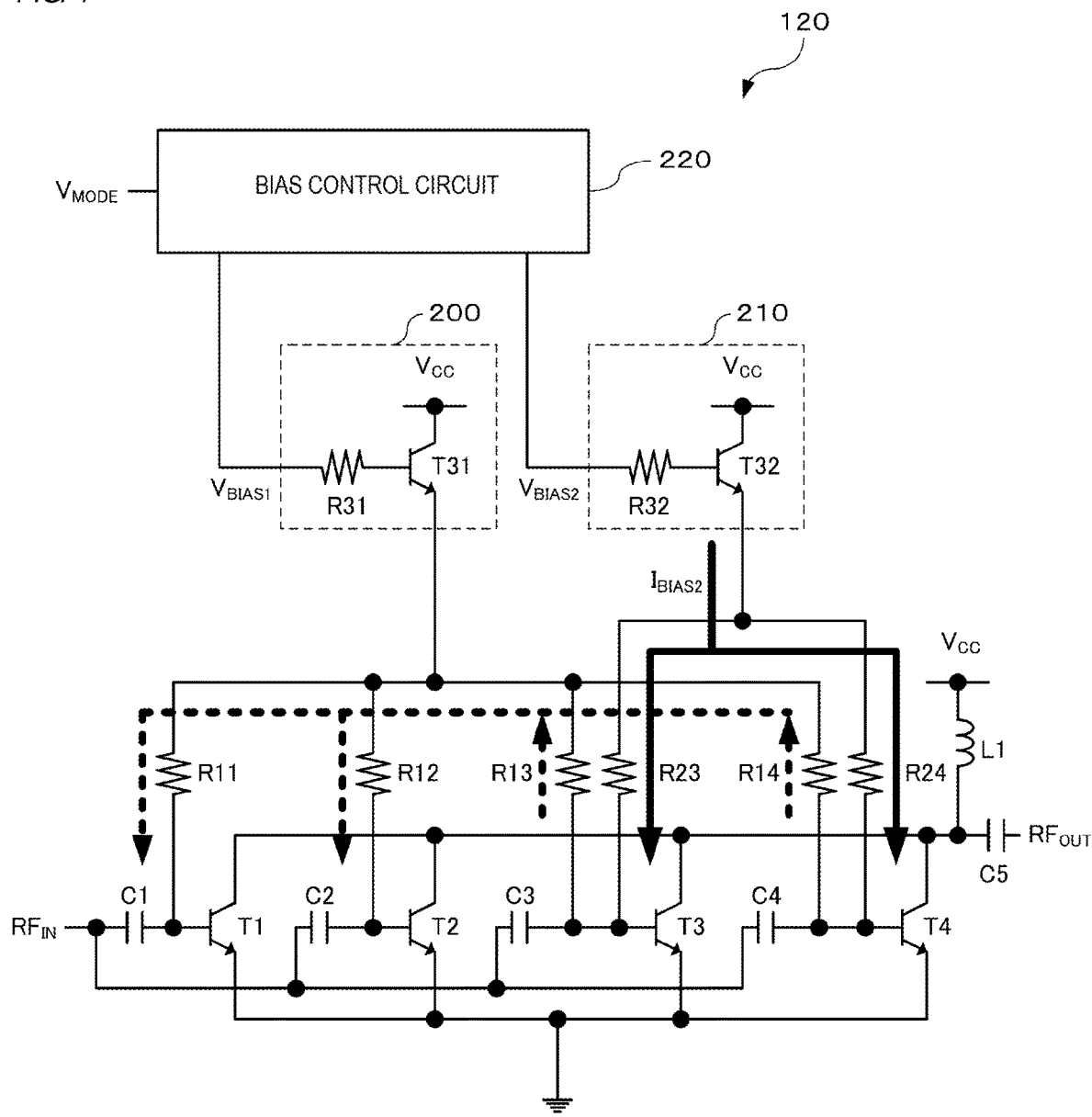
FIG. 4 is a diagram for explaining the operation of the power amplification module in the case of a low gain mode.

Referring to FIGS. 3 and 4, an example of the operation of the power amplification module 120 will be described.

FIG. 3 is a diagram for explaining the operation of the power amplification module 120 in the case of the high gain mode. In the case of the high gain mode, the bias control circuit 220 makes the bias control voltage $V_{BIAS1}$ be at the high level and the bias control voltage $V_{BIAS2}$ be at the low level. Thus, the transistor T31 of the bias circuit 200 is switched on and the transistor T32 of the bias circuit 210 is switched off. The bias current $I_{BIAS1}$ is outputted from the bias circuit 200.

The bias current $I_{BIAS1}$ is supplied to the base of the transistor T1 via the resistor R11. Similarly, the bias current $I_{BIAS1}$ is supplied to the bases of the transistors T2 to T4 via the resistors R12 to R14, respectively. Thus, the transistors T1 to T4 are switched on and the RF signal ($RF_{IN}$) is amplified by the transistors T1 to T4.

FIG. 4 is a diagram for explaining the operation of the power amplification module 120 in the case of the low gain mode. In the case of the low gain mode, the bias control circuit 220 makes the bias control voltage $V_{BIAS1}$ be at the low level and the bias control voltage $V_{BIAS2}$ be at the high level. Thus, the transistor T31 of the bias circuit 200 is switched off and the transistor T32 of the bias circuit 210 is switched on. The bias current $I_{BIAS2}$ is outputted from the bias circuit 210.

The bias current $I_{BIAS2}$ is supplied to the base of the transistor T3 via the resistor R23. Similarly, the bias current $I_{BIAS2}$ is supplied to the base of the transistor T4 via the resistor R24. Thus, the transistors T3 and T4 are switched on.

The bias current $I_{BIAS2}$ is supplied to the base of the transistor T1 via the resistors R23, R13 and R11. Similarly, the bias current $I_{BIAS2}$ is supplied to the base of the transistor T2 via the resistors R23, R13 and R12. In addition, the bias current $I_{BIAS2}$ is supplied to the base of the transistor T1 via the resistors R24, R14 and R11. In addition, the bias current $I_{BIAS2}$ is supplied to the base of the transistor T2 via the resistors R24, R14 and R12. However, the amount of the current supplied to the bases of the transistors T1 and T2 is small compared with the amount of the current supplied to the transistors T3 and T4. Consequently, although the transistors T1 and T2 are not entirely switched off, the size of the emitter current per unit emitter area is small compared with that for the transistors T3 and T4. Therefore, the gain generated by the transistors T1 to T4 is smaller than that in the case of the high gain mode illustrated in FIG. 3.

As described with reference to FIGS. 3 and 4, in the power amplification module 120, the transistors T1 to T4 are switched on by the bias current $I_{BIAS1}$ being supplied to the bases of the transistors T1 to T4 in the case of the high gain mode. In addition, in the case of the low gain mode, the bias current $I_{BIAS2}$ is supplied to the bases of the transistors T3 and T4 and the transistors T3 and T4 are switched on. Furthermore, the bias current $I_{BIAS2}$ is also supplied to the bases of the transistors T1 and T2 via the resistors R13 and R14 and the transistors T1 and T2 enter a state of not being completely switched off.

In the power amplification module 120, the gain can be made to change through this type of operation. In the power amplification module 120, since the transistors T1 and T2 are not completely switched off in the case of the low gain mode, the change in the input impedance can be suppressed compared with the case where the transistors T1 and T2 are completely switched off.

In the power amplification module 120, the number of transistors that form the amplification circuit is four, but the number is not limited to this. Furthermore, in the power amplification module 120, the number of transistors for which the size of the supplied bias current becomes small at the time of the low gain mode is two (transistors T1 and T2), but the number is not limited to this. For example, the number of transistors for which the size of the supplied bias current becomes small at the time of the low gain mode may be three (for example, transistors T1 to T3) or one (for example, transistor T1).

Figure 5:
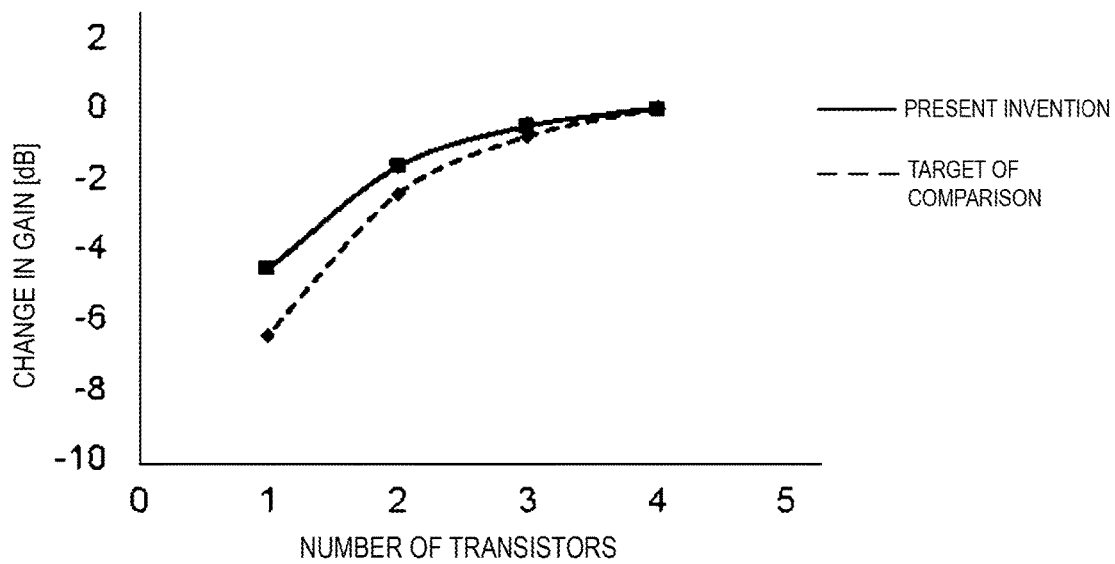
FIG. 5 illustrates an example of the relationship between the number of transistors and a change in gain.
Figure 6:
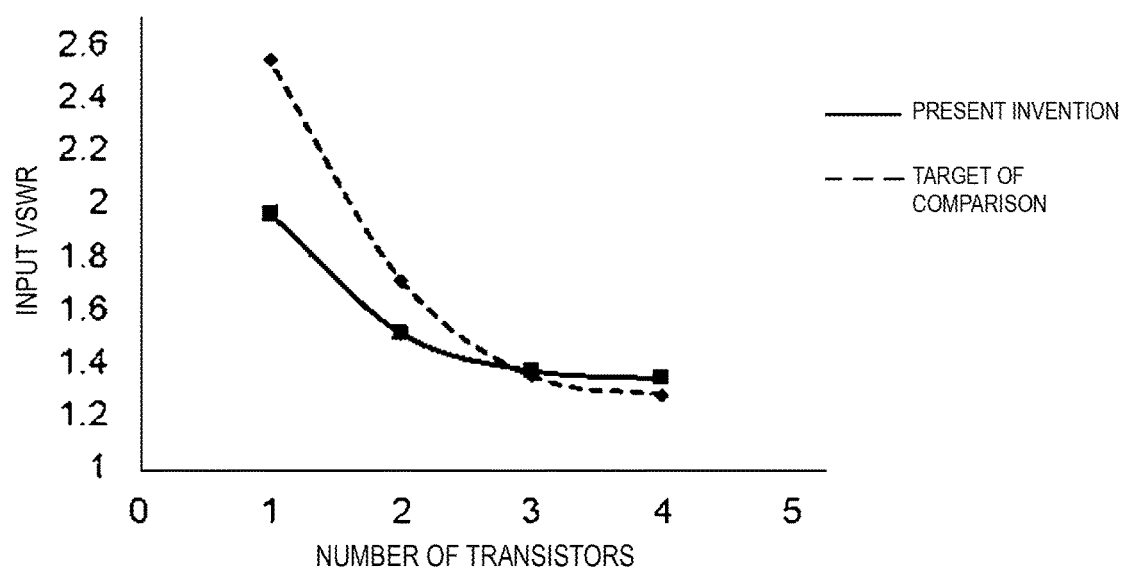
FIG. 6 illustrates an example of the relationship between the number of transistors and the voltage standing wave ratio.

Referring to FIGS. 5 and 6, the characteristics of the power amplification module 120 will be described.

FIG. 5 illustrates an example of the relationship between the number of transistors and the change in gain. The horizontal axis represents the number of transistors that are completely switched on and the vertical axis represents the change in gain, with a state in which the number of transistors that are directly contributing to amplification (that are completely switched on) is four serving as a reference.

In FIG. 5, the solid line represents an example of the simulation results for the same configuration as that of the power amplification module 120 of this embodiment (configuration in which a current is also supplied to transistors that do not directly contribute to amplification). In addition, the broken line represents an example of the simulation results for a typical configuration in which a current is not supplied to transistors that do not directly contribute to amplification. As illustrated in FIG. 5, in the same configuration as that of the power amplification module 120, the gain can be reduced by decreasing the number of transistors that directly contribute to amplification (are completely switched on) at the time of the low gain mode.

FIG. 6 illustrates an example of the relationship between the number of transistors and the voltage standing wave ratio. The horizontal axis represents the number of transistors that are completely switched on and the vertical axis represents the voltage standing wave ratio at the input of the power amplification module (input VSWR).

In FIG. 6, the solid line represents an example of the simulation results for the same configuration as that of the power amplification module 120 (configuration in which a current is also supplied to transistors that do not directly contribute to amplification). In addition, the broken line represents an example of the simulation results for a typical configuration in which a current is not supplied to transistors that do not directly contribute to amplification. As illustrated in FIG. 6, in the same configuration as that of the power amplification module 120, since there are transistors that are not completely switched off at the time of the low gain mode, the change in input impedance is suppressed and as a result the degradation of the input VSWR can be suppressed.

An exemplary embodiment of the present disclosure has been described above. According to the power amplification module 120, the transistors T1 and T2 are not completely switched off at the time of the low gain mode. Consequently, a change in the input impedance that occurs with a change in the gain can be suppressed in the power amplification module 120.

Although the power amplification module 120 is a single-stage amplification circuit, the present disclosure can be similarly applied to an amplification circuit having two or more stages. In the case where the present disclosure is applied to an amplification circuit having two or more stages, the same configuration may be adopted in all of the stages or the same configuration may be adopted in only some of the stages.

Figure 7:
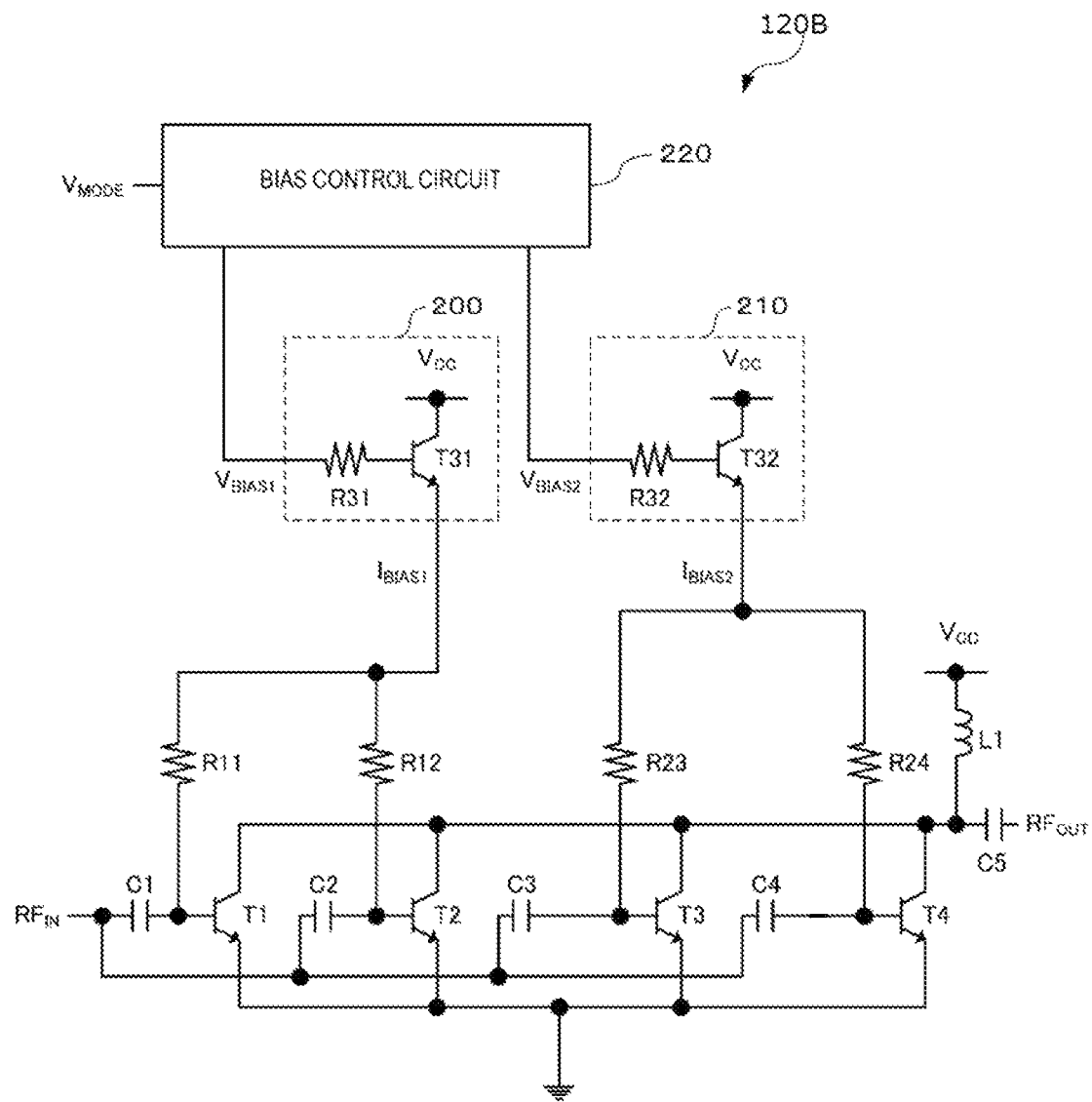
FIG. 7 illustrates an example of the configuration of a power amplification module according to a second embodiment of the present disclosure.

FIG. 7 illustrates a power amplifier 120B according to a second embodiment of the present disclosure. Description of points that are common to this embodiment and FIG. 2 and description of similar configurations are omitted. In the configuration illustrated in FIG. 7, only resistors R11 and R12 are connected to the emitter of the transistor T31. In other words, relative to the configuration illustrated in FIG. 2, the resistor R13 and the resistor R14 have been removed in the configuration illustrated in FIG. 7. In the case of this configuration, in a high power mode operation (a high gain mode), bias control voltages $V_{BIAS1}$ and $V_{BIAS2}$ are respectively supplied to the bases of the transistor T31 and the transistor T32, and bias currents $I_{BIAS1}$ and $I_{BIAS2}$ are supplied from the respective emitters of the transistor T31 and the transistor T32 to the bases of the transistors T1 to T4 via the resistors R11, R12, R23, and R24. In an ideal state, the bias control voltages $V_{BIAS1}$ and $V_{BIAS2}$ would have identical values and the bias currents $I_{BIAS1}$ and $I_{BIAS2}$ would also have identical values and be equal to Icurrent1. However, there will be a certain difference due to processing variations, but these parameters should still have substantially identical values. On the other hand, when operating in a low power mode (a low gain mode), the input impedances of the transistors T1 to T4 seen from $RF_{IN}$ change by a large amount compared with at the time of the high power mode due to the transistors T3 and T4 being completely turned off. Therefore, to prevent input of an RF signal from being obstructed to an increase in VSWR, when operating in the low power mode, a bias control voltage $V_{BIAS1}$ is supplied to the base of the transistor T31 from the bias control circuit 220. A bias control voltage $V_{BIAS2}$ is supplied to the base of the transistor T32 from the bias control circuit 220. A bias control voltage $V_{BIAS2}$ is a lower voltage than a bias control $V_{BIAS1}$. As a result, a bias current $I_{BIAS2}$ (Current 3), which is smaller than the bias current $I_{BIAS1}$ (Current 2) that flows to the emitter of the transistor T31, flows to the emitter of the transistor T32. Since the current $I_{BIAS2}$ is smaller than the current $I_{BIAS1}$, the transistor T3 and the transistor T4 can be switched to a state that is not completely switched off.

As a result of being switched to this state, as illustrated in FIGS. 5 and 6, changes in VSWR can be suppressed while providing a difference in gain. In this configuration, the transistors T1 to T4 are switched on at the time of the high power mode, and in the low power mode it is necessary for the transistors T3 and T4 to be not completely switched off while the transistors T1 and T2 are switched on. The configuration illustrated in FIG. 7 involves more complex control compared with the configuration illustrated in FIG. 2. The values of the currents at the time of the high power mode and the low power mode are illustrated in Table 1, where Current 1>Current 2>Current 3.

Here, in order to find the appropriate value of Current 3, a simulation was performed in order to check the changes in gain and VSWR that occur when the bias current $I_{BIAS1}$ is constant and the bias current $I_{BIAS2}$ is varied. The simulation was based on four drive stage transistors with two transistors driven by each of the transistor T31 and by the transistor T32.

Figure 8:
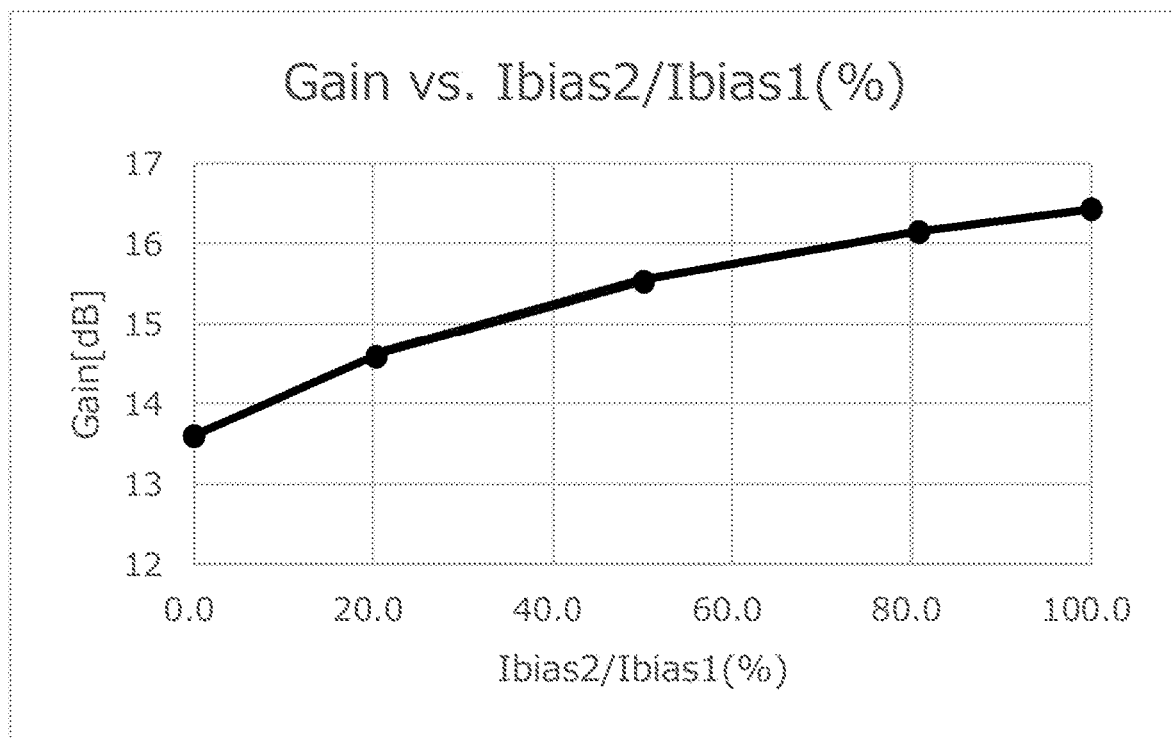
FIG. 8 illustrates a graph of changes in gain in the power amplification module of the second embodiment illustrated FIG. 7.

FIG. 8 illustrates a graph of changes in gain where the horizontal axis represents a ratio between the bias current $I_{BIAS2}$ that flows to the emitter of the transistor T32 and the bias current $I_{BIAS1}$ that flows to the emitter of the transistor T31. When the value of the bias current $I_{BIAS2}$ is identical to that of the current $I_{BIAS1}$ (Current 2), the gain is 16.5 dB. When the current $I_{BIAS2}$ does not flow (i.e., 0.0%), the gain is 13.6 dB. It is clear that the gain changes in a substantially linear manner as the bias current $I_{BIAS2}$ changes.

Figure 9:
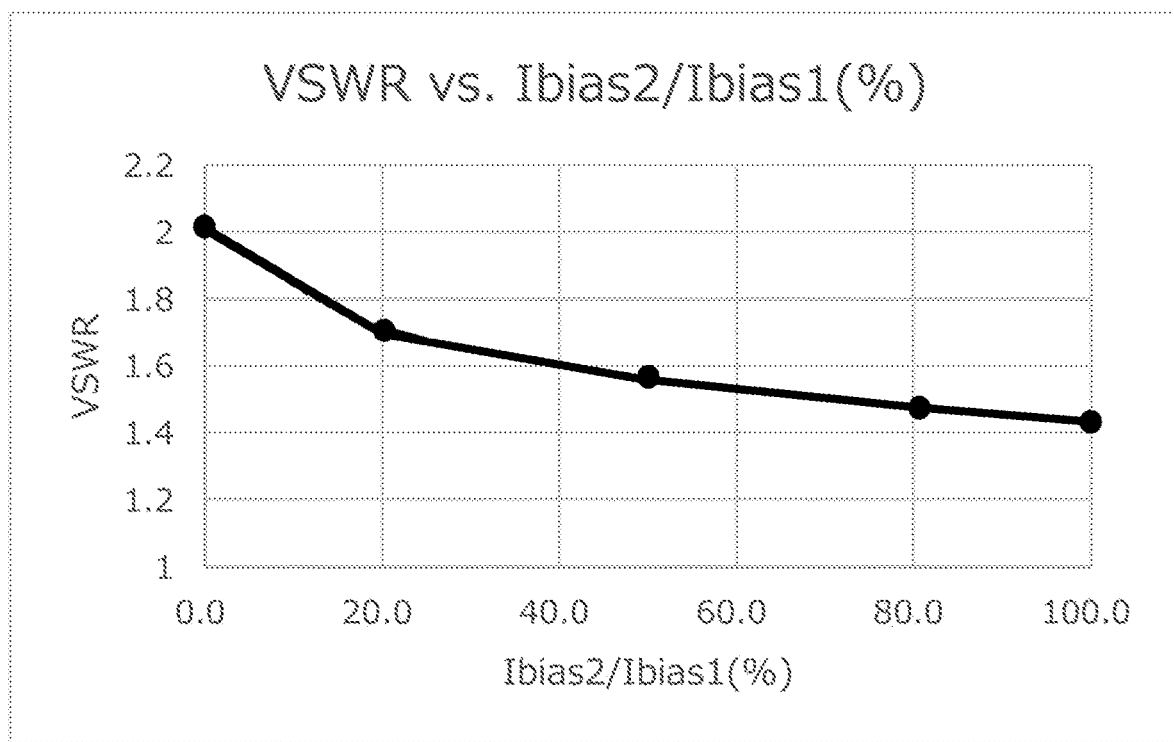
FIG. 9 illustrates a graph of changes in VSWR in the power amplification module of the second embodiment illustrated FIG. 7.

FIG. 9 illustrates a graph of changes in VSWR where the horizontal axis represents a ratio between the bias current $I_{BIAS2}$ that flows to the emitter of the transistor T32 and the bias current $I_{BIAS1}$ that flows to the emitter of the transistor T31. As is clear from the figure, it is clear that VSWR is 2 in the case where the bias current $I_{BIAS2}$ does not flow (i.e., 0.0%) and that the value of VSWR approaches 1.4 as the value of the bias current $I_{BIAS2}$ approaches the value of the bias current $I_{BIAS1}$. However, in contrast to the changes in gain illustrated in FIG. 8, VSWR does not change linearly. In particular, as the bias current $I_{BIAS2}$ approaches 0, VSWR changes sharply. Therefore, from the viewpoint of changes in the VSWR characteristic and gain, the gain is less than 16.5 and VSWR is less than 1.8 in a range in which the bias current $I_{BIAS2}$ is between 20% and 80% of the current $I_{BIAS1}$. Therefore, when operating in the low power mode, a suitable range for Current 3 is from 20% to 80% of Current 2.

TABLE 1

Sizes of emitter currents of transistor T31 and transistor T32 in second and third embodiments.

| | $I_{BIAS1}$ | $I_{BIAS2}$ |
|---|---|---|
| High Power Mode (High Gain Mode) | Current 1 | Current 1 |
| Low Power Mode (Low Gain Mode) | Current 2 | Current 3 |

Figure 10:
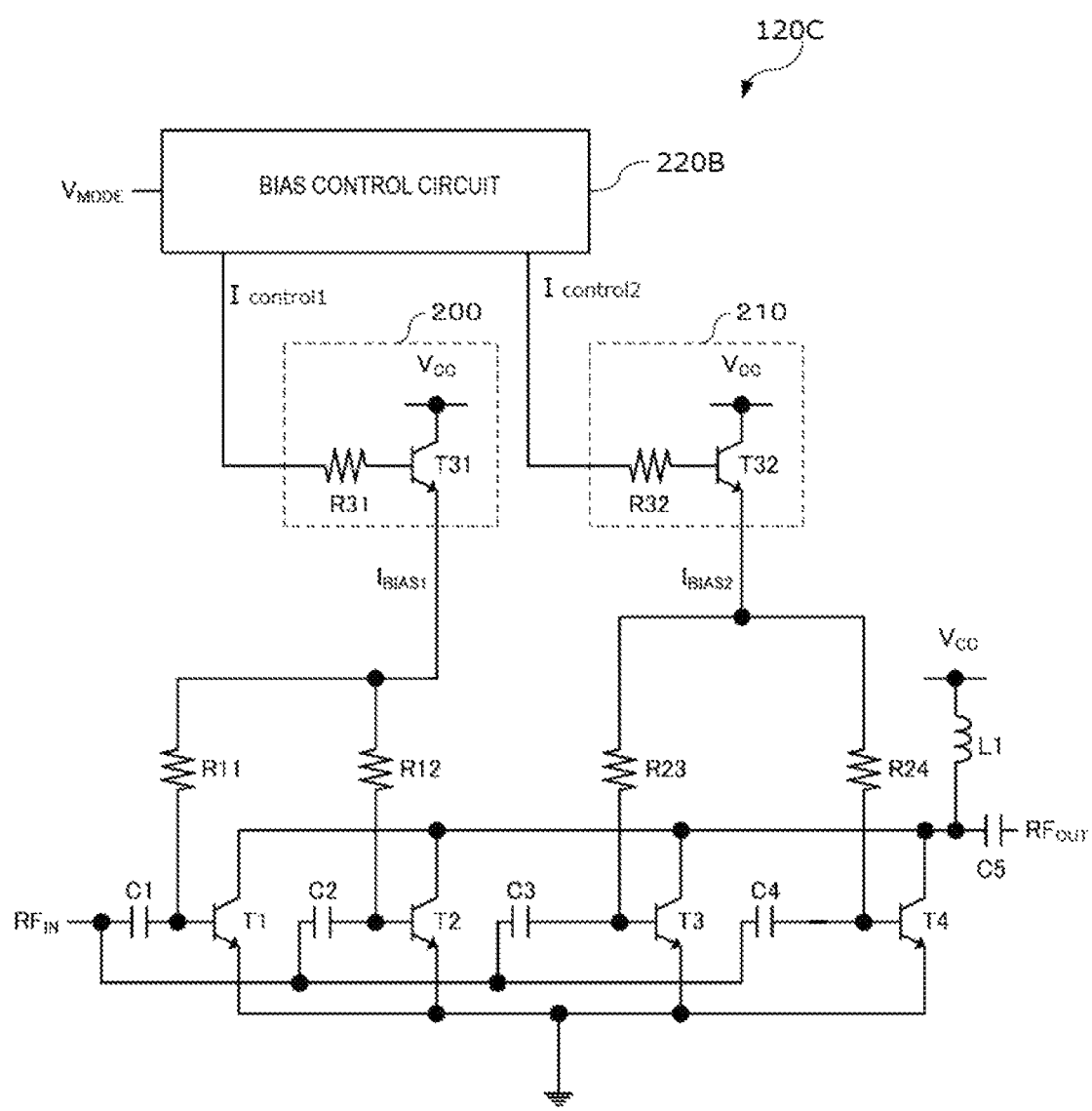
FIG. 10 illustrates an example of the configuration of a power amplification module according to a modification of the second embodiment illustrated in FIG. 7.

FIG. 10 illustrates a power amplifier 120C according to a modification of the second embodiment illustrated in FIG. 7. The configuration illustrated in FIG. 10 differs from the configuration illustrated in FIG. 7 in that the bias control circuit 220 is replaced with a bias control circuit 220B that is a current-control-type bias control circuit that supplies currents Icontrol1 and Icontrol2 to the bases of the transistor T31 and the transistor T32. Due to this configuration, the sensitivity with which the emitter currents of the transistor T31 and the transistor T32 can be adjusted is low compared with the voltage-control-type configuration, and therefore control is easier. Therefore, it is possible to more finely control adjustment of VSWR and adjustment of gain at the time of the low power mode. The values of the bias currents $I_{BIAS1}$ and $I_{BIAS2}$ are hfe (current amplification factor) times as large as the values of the currents that flow to the bases of the transistors T31 and T32, and therefore there is a proportional relationship between the currents Icontrol1 and Icontrol2. Therefore, it may be said that the value of the current Icontrol2 when operating in the low power mode suitably lies between 20% and 80% of the current Icontrol1.

The purpose of the embodiments described above is to enable easy understanding of the present disclosure and the embodiments are not to be interpreted as limiting the present disclosure. The present disclosure can be modified or improved without departing from the gist of the disclosure and equivalents to the present disclosure are also included in the present invention. In other words, appropriate design modifications made to the embodiments by one skilled in the art are included in the scope of the present disclosure so long as the modifications have the characteristics of the present disclosure. For example, the elements included in the embodiments and the arrangements, materials, conditions, shapes, sizes and so forth of the elements are not limited to those exemplified in the embodiments and can be appropriately changed. In addition, the elements included in the embodiments can be combined as much as technically possible and such combined elements are also included in the scope of the present disclosure so long as the combined elements have the characteristics of the present disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplification module comprising:
   a first transistor, a first signal being inputted to a base of the first transistor;
   a second transistor, the first signal being inputted to a base of the second transistor and a collector of the second transistor being connected to a collector of the first transistor;
   a third transistor, the first signal being inputted to a base of the third transistor, and a collector of the third transistor being connected to the collector of the second transistor;
   a first resistor, a first bias current being supplied to a first end of the first resistor and a second end of the first resistor being connected to the base of the first transistor;
   a second resistor, a first end of the second resistor being connected to the first end of the first resistor, and a second end of the second resistor being connected to the base of the second transistor; and
   a third resistor, a second bias current being supplied to a first end of the third resistor and a second end of the third resistor being connected to the base of the third transistor, wherein:
   when the power amplification module operates in a high gain mode (a high power mode), the first bias current is supplied to the base of the first transistor via the first resistor and to the base of the second transistor via the second resistor, and the second bias current is supplied to the base of the third transistor via the third resistor,
   when the power amplification module operates in a low gain mode (a low power mode), the first bias current is supplied to the base of the first transistor via the first resistor and to the base of the second transistor via the second resistor, and the second bias current is supplied to the base of the third transistor via the third resistor, and
   when the power amplification module operates in the low gain mode (a low power mode), the second bias current has a non-zero value that is less than a value of the first bias current.

2. The Power amplification module according to claim 1, further comprising:
   a fourth transistor, the first signal being inputted to a base of the fourth transistor and a collector of the fourth transistor being connected to a collector of the first transistor; and
   a fourth resistor, a first end of the fourth resistor being connected to the first end of the third resistor and a second end of the fourth resistor being connected to the base of the fourth transistor.

3. The Power amplification module according to claim 1, wherein the value of the second bias current is between 20% and 80% of the value of the first bias current.

4. The Power amplification module according to claim 2, wherein the value of the second bias current is between 20% and 80% of the value of the first bias current.

5. The Power amplification module according to claim 1, further comprising:
   a bias control circuit configured to control the value of the second bias current and to control the value of the first bias current,
   wherein the bias control circuit is a current-control-type bias control circuit.

6. The Power amplification module according to claim 2, further comprising:
   a bias control circuit configured to control the value of the second bias current and to control the value of the first bias current,
   wherein the bias control circuit is a current-control-type bias control circuit.

7. The Power amplification module according to claim 3, further comprising:
   a bias control circuit configured to control the value of the second bias current and to control the value of the first bias current,
   wherein the bias control circuit is a current-control-type bias control circuit.

8. The Power amplification module according to claim 4, further comprising:
   a bias control circuit configured to control the value of the second bias current and to control the value of the first bias current,
   wherein the bias control circuit is a current-control-type bias control circuit.

* * * * *